United States Patent [19]
Hsu

[11] Patent Number: 5,552,343
[45] Date of Patent: Sep. 3, 1996

[54] METHOD FOR TAPERED CONTACT FORMATION

[75] Inventor: Iman Hsu, Miao Li, Taiwan

[73] Assignee: Taiwan Semiconductor Manufacturing Company, Hsin-Chu, Taiwan

[21] Appl. No.: 545,385

[22] Filed: Oct. 19, 1995

[51] Int. Cl.⁶ .................................................. H01L 21/28
[52] U.S. Cl. .................... 437/195; 437/231; 437/981; 437/982
[58] Field of Search ........................ 437/187, 195, 437/147, 981, 982, 231, 228 CON, 228 PL

[56] References Cited

U.S. PATENT DOCUMENTS

| | | | |
|---|---|---|---|
| 4,902,377 | 2/1990 | Berglund et al. | 156/643 |
| 4,983,546 | 1/1991 | Hyun et al. | 437/173 |
| 4,986,878 | 1/1991 | Malazgirt et al. | 437/61 |
| 5,164,340 | 11/1992 | Chen et al. | 437/236 |
| 5,393,708 | 2/1995 | Hsia et al. | 437/228 |
| 5,399,533 | 3/1995 | Promanik et al. | 437/231 |

FOREIGN PATENT DOCUMENTS 01286442  11/1989  Japan .

*Primary Examiner*—George Fourson
*Assistant Examiner*—Thomas G. Bilodeau
*Attorney, Agent, or Firm*—George O. Saile; Larry J. Prescott

[57] ABSTRACT

This invention provides a method of forming a bowled contact or via hole in a boron and phosphorous doped tetraethyl orthosilicate, BPTEOS, dielectric film which will provide superior edge coverage when filled with metal. The bowled contact or via hole has an edge profile with a small entry angle, the angle between the surface of the dielectric film and the line tangent to the contact or via hole edge profile. The method of this invention uses a 10:1 Buffered Oxide Etch, BOE, to remove the densified region on the surface of the BPTEOS film. The contact or via hole is then formed using isotropic etching followed by a vertical anisotropic etch.

14 Claims, 4 Drawing Sheets

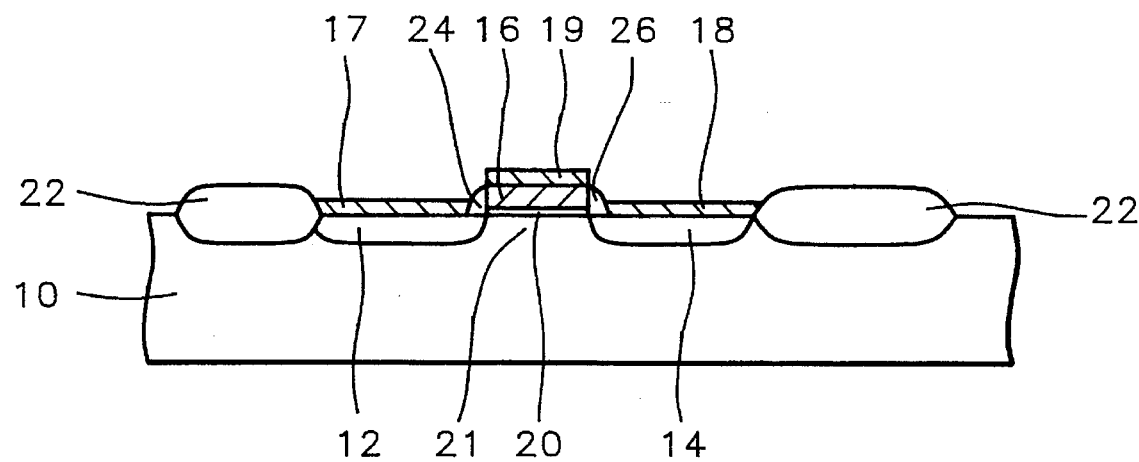
FIG. 1 — Prior Art
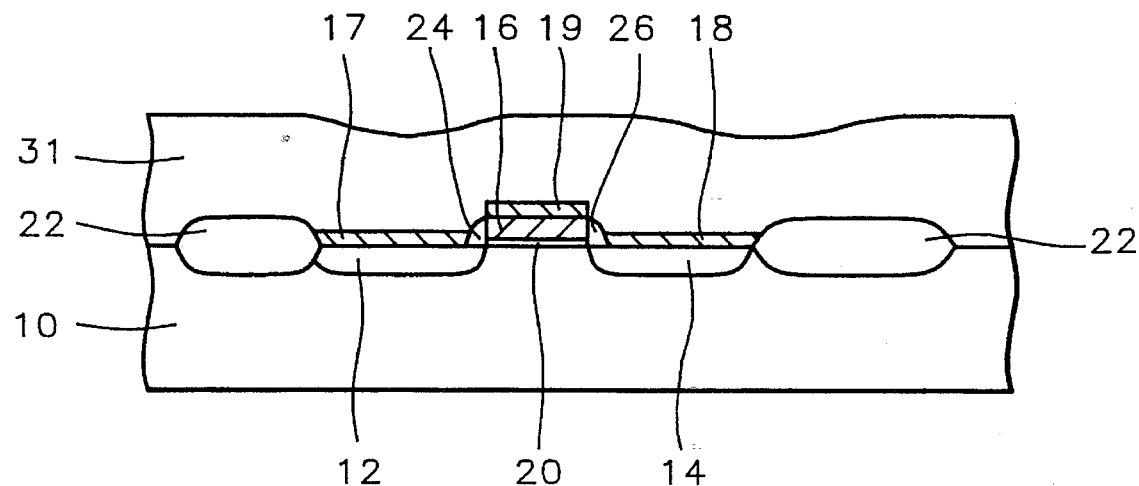
FIG. 2 — Prior Art
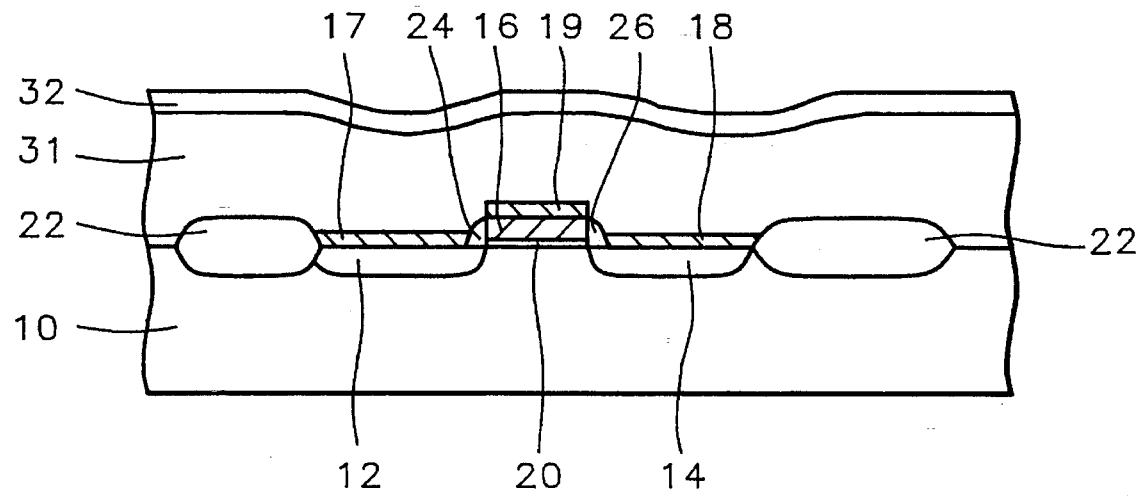
FIG. 3 — Prior Art

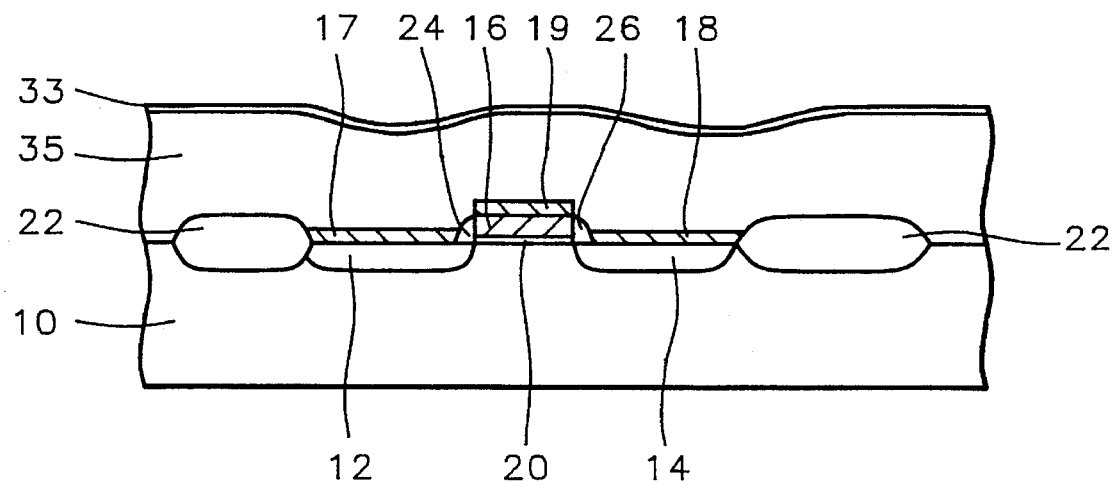
FIG. 4 – Prior Art
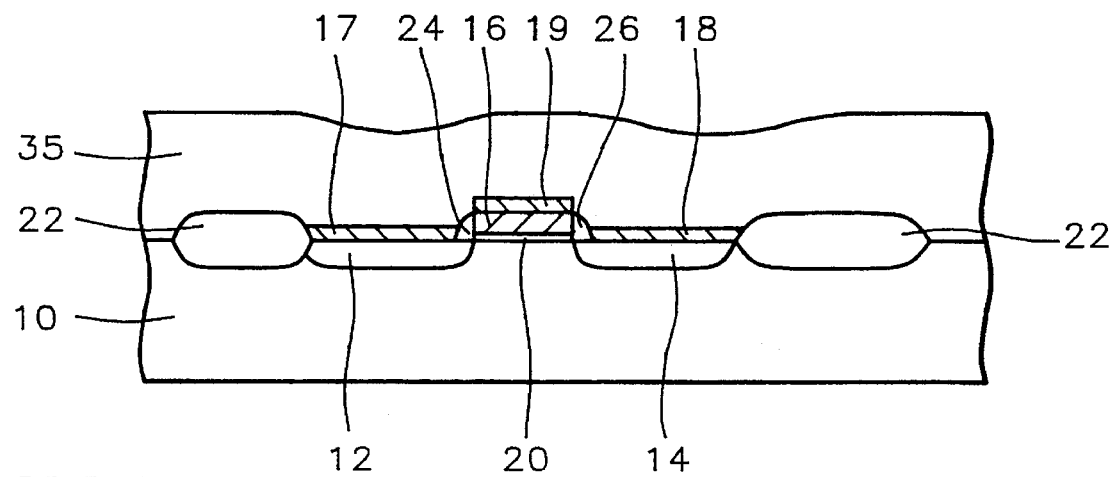
FIG. 5
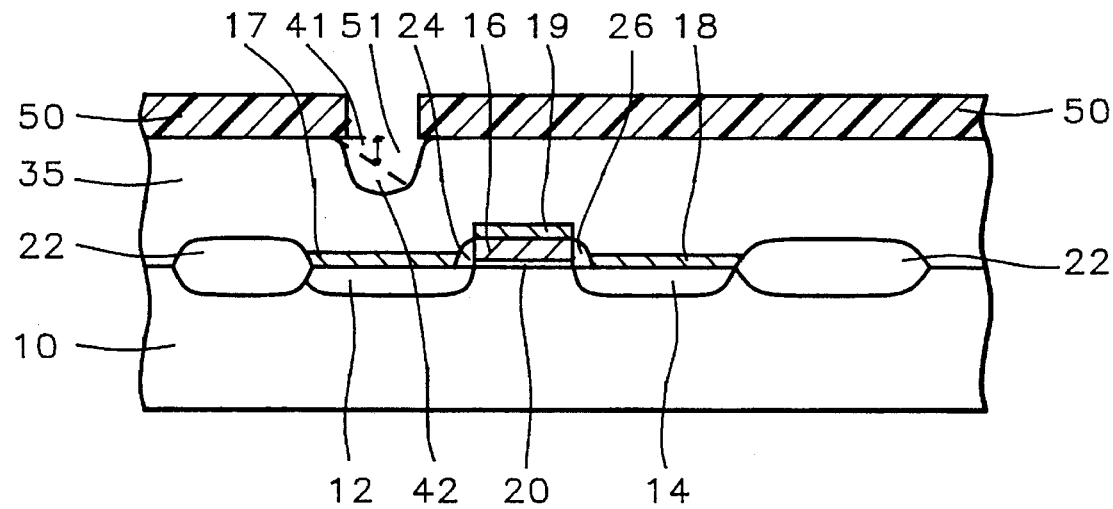
FIG. 6

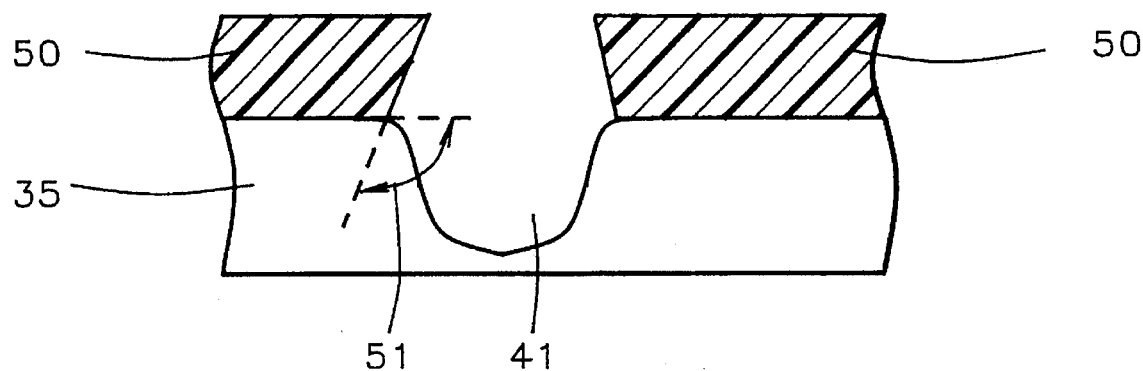
*FIG. 7 - Prior Art*
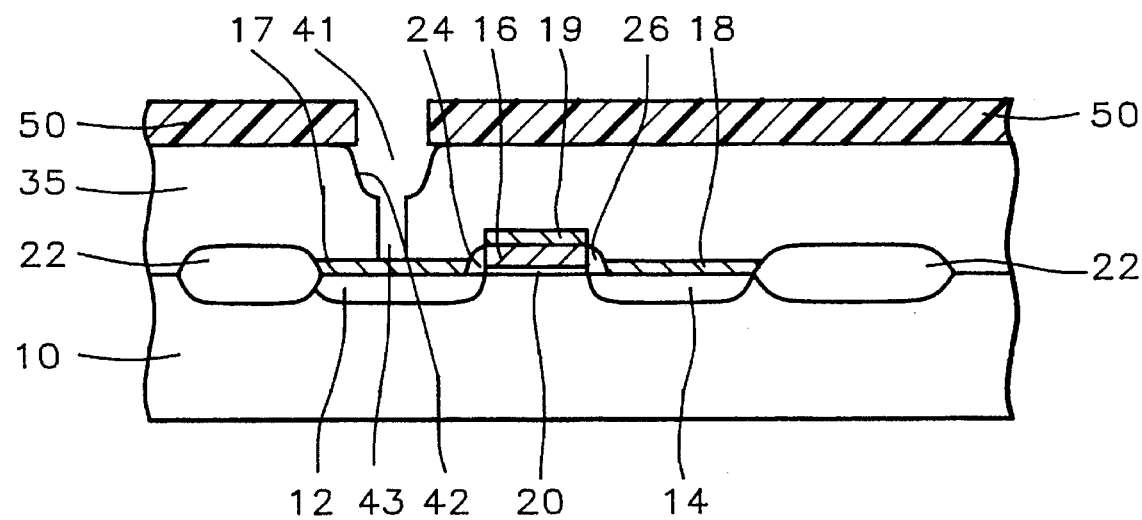
*FIG. 8*

METHOD FOR TAPERED CONTACT FORMATION

BACKGROUND OF THE INVENTION

(1) Field of the Invention

The invention relates to a novel process flow for the formation of tapered contacts in boron and phosphorous doped tetraethyl orthosilicate, BPTEOS, films to achieve superior metal edge coverage when the contacts are filled with metal. The method uses a Buffered Oxide Etch, BOE, to remove a densified layer from the BPTEOS film followed by an isotropic etch and vertical anisotropic etch of the contact hole.

(2) Description of Related Art

Good metal step coverage is very important when filling contact or via holes in dielectrics with metal in the manufacture of integrated circuits. It is well recognized that tapered edges of the contact or via holes having a small entry angle, the angle between the surface of the dielectric film and the line tangent to the contact or via hole edge profile, is of critical importance in achieving good metal step coverage. U.S. Pat. No. 4,902,377 to Berglund et al., U.S. Pat. No. 5,164,340 to Chen et al., and Japanese Patent JA 1-286442 to Ito teach methods for forming tapered contacts which. The method taught by this Invention uses process steps which differ from these. The method taught by this Invention provides a tapered contact or via hole with a small entry angle thereby achieving good edge coverage when the contact or via hole is filled with metal. The extra steps taught by this Invention to achieve a tapered contact or via hole do not appreciably reduce the throughput rate for contact or via hole formation.

SUMMARY OF THE DISCLOSURE

The importance of good metal step coverage when filling contact or interlevel via holes in dielectrics with metal in the manufacture of integrated circuits is well recognized. It is also well recognized that tapered edges of the contact or via holes having a small entry angle, the angle between the surface of the dielectric film and the line tangent to the contact or via hole edge profile, is of critical importance in achieving good metal step coverage. It is also important in the manufacture of integrated circuits that the formation of tapered contact holes or vias be accomplished without significantly increasing processing time thereby reducing throughput and increasing costs.

It is the principle objective of this invention to provide a method of forming tapered contact holes in dielectric films which will achieve superior metal step coverage and will not significantly increase process time.

This objective is achieved by using a 10:1 wet buffered oxide etch to remove a densified layer of the dielectric layer before the contact hole is formed. The contact hole is then formed using an isotropic etch followed by a vertical anisotropic etch. This series of process steps provides the desired edge profile for the contact hole and does not significantly increase process time.

BRIEF DESCRIPTION OF THE DRAWINGS

FIG. 1 shows a cross section view of a semiconductor substrate having source and drain regions, field oxide isolation regions, a gate oxide region, a gate electrode, and metal silicide contact regions formed therein.

FIG. 2 shows a cross section view of the semiconductor substrate with a first dielectric layer formed of plasma enhanced TEOS and boron and phosphorous doped TEOS layers.

FIG. 3 shows a cross section view of the semiconductor substrate with a layer of spin on glass formed on the first dielectric layer.

FIG. 4 shows a cross section view of the semiconductor substrate with the densified layer.

FIG. 5 shows a cross section view of the semiconductor substrate after the densified layer has been removed.

FIG. 6 shows the semiconductor substrate after isotropic etching has formed the first partial contact hole region using the methods of this invention.

FIG. 7 shows a cross section of a first partial contact hole region formed using conventional methods.

FIG. 8 shows the semiconductor substrate after vertical anisotropic etching has formed the second contact hole region.

DESCRIPTION OF THE PREFERRED EMBODIMENTS

Figure 9:
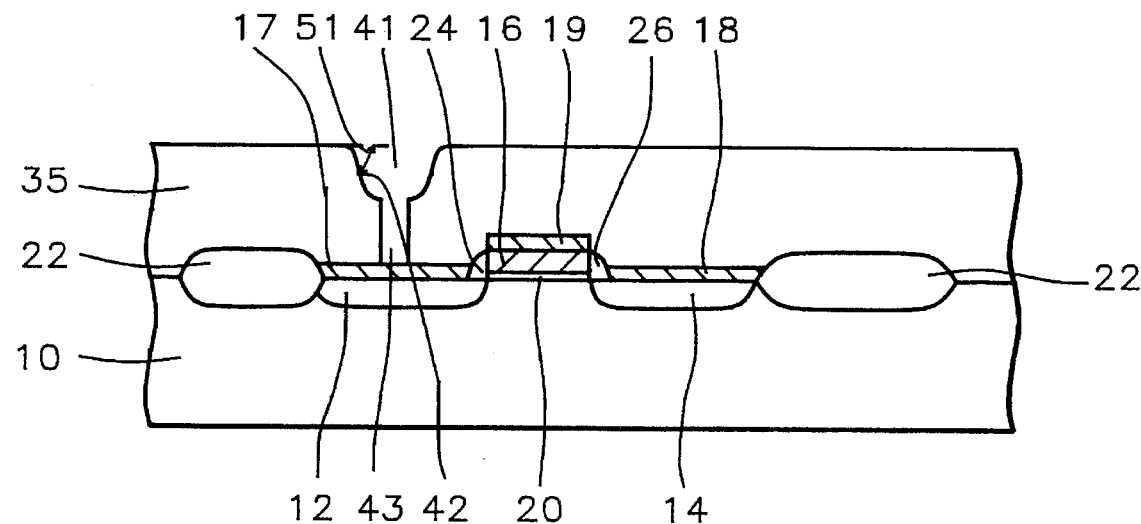
FIG. 9 shows the semiconductor substrate after formation of the contact hole and removal of the photoresist.

Refer now to FIGS. 1 through 8, there is shown an embodiment to this invention. FIG. 1 shows a cross section view of a semiconductor substrate 10 with source 12, drain 14, and field oxide isolation regions 22 formed therein. A gate oxide 20 is formed over the channel region 21 and a polysilicon gate electrode 16 is formed on the gate oxide 20. First 24 and second 26 oxide spacers are formed at the sides of the gate electrode 16. A first contact region 17 is formed over the source 12, a second contact region 18 is formed over the drain 14, and a third contact region 19 is formed over the gate electrode 16. The first, second, and third contact regions are formed of a metal silicide such as titanium silicide, Ti $Si_x$.

Next as shown in FIG. 2, a first dielectric layer 31 is formed over the semiconductor substrate 10, field oxide regions 22, first contact region 17, second contact region 18, third contact region 18, first oxide spacer 24, and second oxide spacer 26. The first dielectric layer 31 is formed by depositing about 2000 Angstroms of plasma enhanced tetraethyl orthosilicate, PETEOS, and about 9000 Angstroms of boron and phosphorous doped tetraethyl orthosilicate, BPTEOS, and reflowing at about 800° C. for about 30 minutes.

Next, as shown in FIG. 3 a layer of spin on glass 32, SOG, about 1350 Angstroms thick is formed on the first dielectric layer 31 and cured at about 420° C. for about 35 minutes. The cured SOG layer and first dielectric layer together form a second dielectric layer 35 which is then etched back to a thickness of about 7200 Angstroms. The etchback leaves a densified region 33 at the top of the second dielectric layer 35, see FIG. 4.

Next the densified layer 33 is removed using a 10:1 Buffered Oxide Etch leaving the second dielectric layer 35 with the densified layer removed as shown in FIG. 5. This step is of critical importance in obtaining the desired contact hole profile when the contact hole is formed.

Next, as shown in FIG. 6, a layer of photoresist 50 with holes at the locations where the contact holes will be formed in the second dielectric layer is formed on the second dielectric layer 35. A first contact hole region 41 is then formed in the second dielectric layer 35 at the location of the holes in the photoresist layer using isotropic etching. The isotropic etching provides a side profile 42 of the first contact hole region 41 having a an entrance angle 51 between the horizontal surface of the second dielectric layer 35 and the side profile 42 of the first contact hole region of less than 90°.

If the 10:1 Buffered Oxide Etch is not used to remove the densified region before the first contact hole region 41 is formed the entrance angle 51 between the horizontal surface of the second dielectric layer 35 and the side profile 42 of the first contact hole region will be greater than 90°, as shown in FIG. 7. In this case the step coverage when the completed contact hole is filled with conductor metal will be poor.

Figure 10:
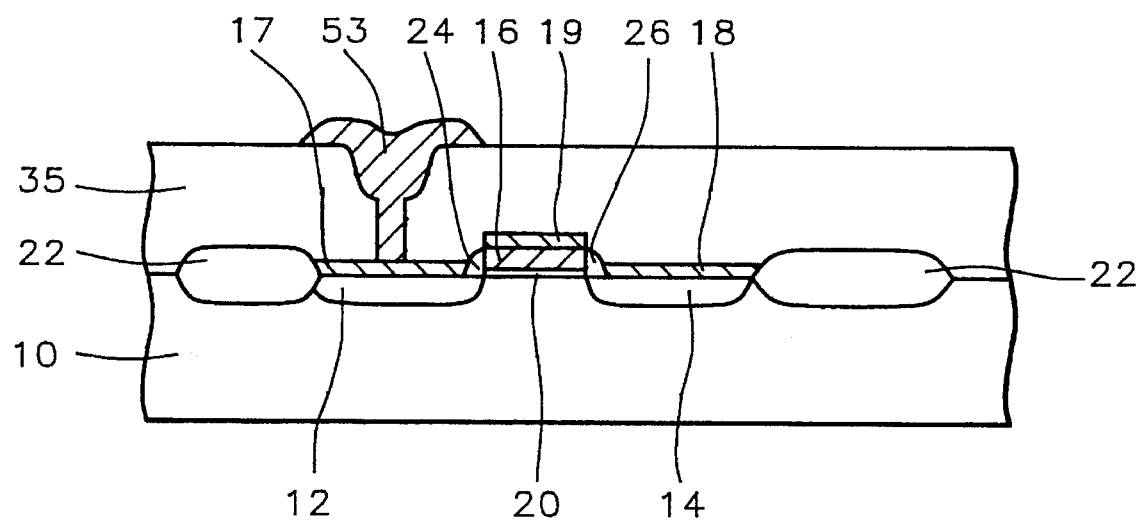
FIG. 10 shows the completed contact hole after filling with metal.

As shown in FIG. 8, the second contact hole region 43 is then formed to expose the metal silicide contact region 17 by means of vertical anisotropic etching. As shown in FIG. 9, the photoresist layer is then removed and the small entrance angle 51 of much less than 90° insures good metal step coverage when the contact hole is filled with metal. As shown in FIG. 10, the contact hole is then filed with metal 53.

While this embodiment has described the formation of one contact hole it can be readily seen that the method is equally applicable to the formation of a number of contact holes.

While the invention has been particularly shown and described with reference to the preferred embodiments thereof, it will be understood by those skilled in the art that various changes in form and details may be made without departing from the spirit and scope of the invention.

What is claimed is:

1. A method of forming contact holes, comprising the steps of:

provinding a semiconductor substrate having source and drain regions formed therein;

forming a patterned gate oxide layer on said semiconductor substrate;

forming a gate electrode on said gate oxide layer;

forming silicide contact regions on said gate electrode and said source and drain regions;

forming a first dielectric layer on said semiconductor substrate wherein said first dielectric covers said gate electrode, said silicide contact regions, and said source and drain regions;

reflowing said first dielectric layer;

forming a second dielectric layer over said first dielectric layer;

curing said second dielectric layer whereby said first dielectric layer and said second dielectric layer form a third dielectric layer having a horizontal top surface;

etching back said third dielectric layer whereby a densified region is formed on said horizontal top surface of said third dielectric layer;

removing said densified region by means of a wet buffered oxide etch;

forming a layer of photoresist having contact hole openings over said third dielectric layer after said densified layer has been removed;

forming a partial contact hole having a side profile in said third dielectric layer by means of isotropic etching said third dielectric layer using said layer of photoresist having contact hole openings as a mask;

forming a complete contact hole in said third dielectric layer by means of vertical anisotropic etching said third dielectric layer using said layer of photoresist having contact hole openings as a mask; and stripping said layer of photoresist.

2. The method of claim 1 wherein said silicide contact regions comprise tungsten silicide.

3. The method of claim 1 wherein said first dielectric layer comprises a film formed by plasma enhanced chemical vapor deposition using tetraethyl orthosilicate and a boron and phosphorous doped film formed using tetraethyl orthosilicate.

4. The method of claim 3 wherein said film formed by plasma enhanced chemical vapor deposition using tetraethyl orthosilicate has a thickness of between about 1700 and 2300 Angstrom and said boron and phosphorous doped film formed using tetraethyl orthosilicate has a thickness of between about 7650 and 10,350 Angstroms.

5. The method of claim 1 wherein said reflowing of said first dielectric layer uses a temperature of between about 680° C. and 920° C.

6. The method of claim 1 wherein said second dielectric layer is spin on glass having a thickness of between about 1150 Angstroms and 1550 Angstroms.

7. The method of claim 1 wherein said curing of said second dielectric layer uses a temperature of between about 360° C. and 480° C.

8. The method of claim 1 wherein said side profile of said partial contact hole formed in said third dielectric layer forms an entrance angle with said horizontal top surface of said third dielectric layer of less than 90°.

9. A method of forming contact holes, comprising the steps of:

providing a semiconductor substrate having devices formed therein and a dielectric layer having a horizontal top surface formed thereon;

etching back said dielectric layer thereby forming a densified region on said horizontal top surface of said dielectric layer;

removing said densified region by means of a wet buffered oxide etch;

forming a layer of photoresist having contact hole openings over said dielectric layer after said densified layer has been removed;

forming a partial contact hole having a side profile in said dielectric layer by means of isotropic etching said dielectric layer using said layer of photoresist having contact hole openings as a mask;

forming a complete contact hole in said dielectric layer by means of vertical anisotropic etching said dielectric layer using said layer of photoresist having contact hole openings as a mask; and stripping said layer of photoresist.

10. The method of claim 9 wherein said dielectric layer comprises a film formed by plasma enhanced chemical vapor deposition using tetraethyl orthosilicate and a boron and phosphorous doped film formed using tetraethyl orthosilicate.

11. The method of claim 10 wherein said film formed by plasma enhanced chemical vapor deposition using tetraethyl orthosilicate has a thickness of between about 1700 and 2300 Angstrom and said boron and phosphorous doped film formed using tetraethyl orthosilicate has a thickness of between about 7650 and 10,350 Angstroms.

12. The method of claim 9 wherein said dielectric layer comprises spin on glass having a thickness of between about 1150 Angstroms and 1550 Angstroms.

13. The method of claim 12 wherein said spin on glass is cured at a temperature of between about 360° C. and 480° C.

14. The method of claim 9 wherein said side profile of said partial contact hole formed in said third dielectric layer forms an entrance angle with said horizontal top surface of said third dielectric layer of less than 90°.

* * * * *